(12) United States Patent
Gates et al.

(10) Patent No.: US 6,724,077 B2
(45) Date of Patent: Apr. 20, 2004

(54) SEMICONDUCTOR PACKAGE HAVING MULTI-SIGNAL BUS BARS

(75) Inventors: Tim M. Gates, Hillsboro, OR (US); Brent S. Stone, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 135 days.

(21) Appl. No.: 09/986,715

(22) Filed: Nov. 9, 2001

(65) Prior Publication Data

US 2003/0089970 A1 May 15, 2003

(51) Int. Cl.[7] .............................................. H01L 23/52
(52) U.S. Cl. ...................... 257/691; 257/698; 257/713
(58) Field of Search ................................ 257/691, 698, 257/713, 678, 687, 690; 438/106, 121

(56) References Cited

U.S. PATENT DOCUMENTS

| | | | |
|---|---|---|---|
| 4,654,472 A | 3/1987 | Goldfarb | 174/52 |
| 4,976,624 A | 12/1990 | Ishizuka et al. | 439/70 |
| 5,737,192 A * | 4/1998 | Linderman | 361/790 |
| 6,097,086 A | 8/2000 | Crane, Jr. et al. | 257/692 |
| 6,388,207 B1 * | 5/2002 | Figueroa et al. | 257/698 |
| 6,503,090 B2 * | 1/2003 | Onizuka | 439/75 |
| 2002/0004335 A1 * | 1/2002 | Onizuka | 439/567 |

OTHER PUBLICATIONS

Patent Abstracts of Japan, vol. 199, No. 8, Jun. 30, 1999, & JP 11 067985 (Hiroshima Nippon Denki KK), Mar. 9, 1999.

* cited by examiner

Primary Examiner—Steven Loke
Assistant Examiner—Douglas W. Owens
(74) Attorney, Agent, or Firm—Kenyon & Kenyon

(57) ABSTRACT

A fabrication method and semiconductor package provide enhanced performance. The semiconductor package includes a semiconductor die having an integrated circuit (IC), and a substrate having a die side coupled to the IC. A plurality of multi-signal bus bars is coupled to a socket side of the substrate such that the bus bars enable I/O signals to be transported between the substrate and a socket.

3 Claims, 3 Drawing Sheets

SEMICONDUCTOR PACKAGE HAVING MULTI-SIGNAL BUS BARS

CROSS-REFERENCE TO RELATED APPLICATIONS

The present invention relates to U.S. patent application Ser. No. 09/753,327, filed on Dec. 30, 2000.

BACKGROUND OF THE INVENTION

1. Technical Field

The present invention generally relates to semiconductor packages. More particularly, the invention relates to a semiconductor package having a multi-signal bus bar architecture.

2. Discussion

In the computer industry, there is a well documented trend toward faster processing speeds and enhanced functionality. While the above trend is highly desirable to the consumer, it presents significant challenges to chip designers and manufacturers. One area of particular concern is semiconductor packaging. A primary function of the typical semiconductor package is to facilitate electrical interconnection between an integrated circuit (IC) such as a computer processor encapsulated within a semiconductor die, and a printed wiring board (PWB) on which various other components are mounted. One approach is to use a substrate having a die side coupled to the IC and a socket interface, which allows the semiconductor package to be "plugged" into a mating socket such as a zero insertion force (ZIF) socket. The socket interface under such an approach has traditionally been a uniform pin architecture, wherein each pin enables a reference or input/output (I/O) signal to be transported between the substrate and the socket.

While the above approach has provided an acceptable solution under certain conditions, the trend toward faster clock speeds and increased functionality has resulted in an increased demand for current that cannot fully be met under the traditional uniform pin architecture. In response to the above-described need, certain approaches to modifying the socket interface have involved the use of a hybrid architecture, which includes both pins and bus bars. Under such an approach, pins enable I/O signals to be transported between the substrate and the socket, whereas bus bars are used for reference signals. The conventional bus bar has a first member, a second member and a dielectric "sandwiched" between the first and second members. The first and second members typically transport reference signals such as $V_{cc}$ or $V_{SS}$ to the processor, and have a relatively large planar geometry to increase power handling capacity.

It is important to note that while the above-described hybrid architecture has increased the power handling capacity of conventional semiconductor packages, certain difficulties remain. A particular concern relates to the manufacturability of the semiconductor package. For example, it has been determined that it is difficult to maintain acceptable pin alignment tolerances when the socket interface utilizes the hybrid architecture. Furthermore, conventional designs for the outer members of the bus bar prohibit the use of bus bars for I/O signals due to the large amount of area taken up by each bus bar.

BRIEF DESCRIPTION OF THE DRAWINGS

The various advantages of the present invention will become apparent to one skilled in the art by reading the following specification and appended claims, and by referencing the following drawings, in which:

DETAILED DESCRIPTION OF THE PREFERRED EMBODIMENTS

A fabrication method and semiconductor package in accordance with the present invention provide enhanced performance. The semiconductor package includes a semiconductor die having an IC, and a substrate having a die side coupled to the IC. A plurality of multi-signal bus bars is coupled to a socket side of the substrate such that the bus bars enable I/O signals to be transported between the substrate and a socket. By using multi-signal bus bars, difficulties with respect to current capacity, manufacturability, and other issues are obviated.

In another aspect of the invention, a multi-signal bus bar is provided. The bus bar includes a dielectric member and an electrically conductive reference member coupled to a first surface of the dielectric member. The reference member defines a current path for a reference signal. A plurality of electrically conductive I/O members are coupled to a second surface of the dielectric member such that the I/O members define current paths for a corresponding plurality of I/O signals.

Further in accordance with the present invention, a method of fabricating a multi-signal bus bar includes the process of providing a dielectric member. An electrically conductive reference member is coupled to a first surface of the dielectric member, where the reference member defines a current path for a reference voltage signal. The method further provides for coupling a plurality of electrically conductive I/O members to a second surface of the dielectric members such that the I/O member define current paths for a corresponding plurality of I/O signals.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

Figure 1:
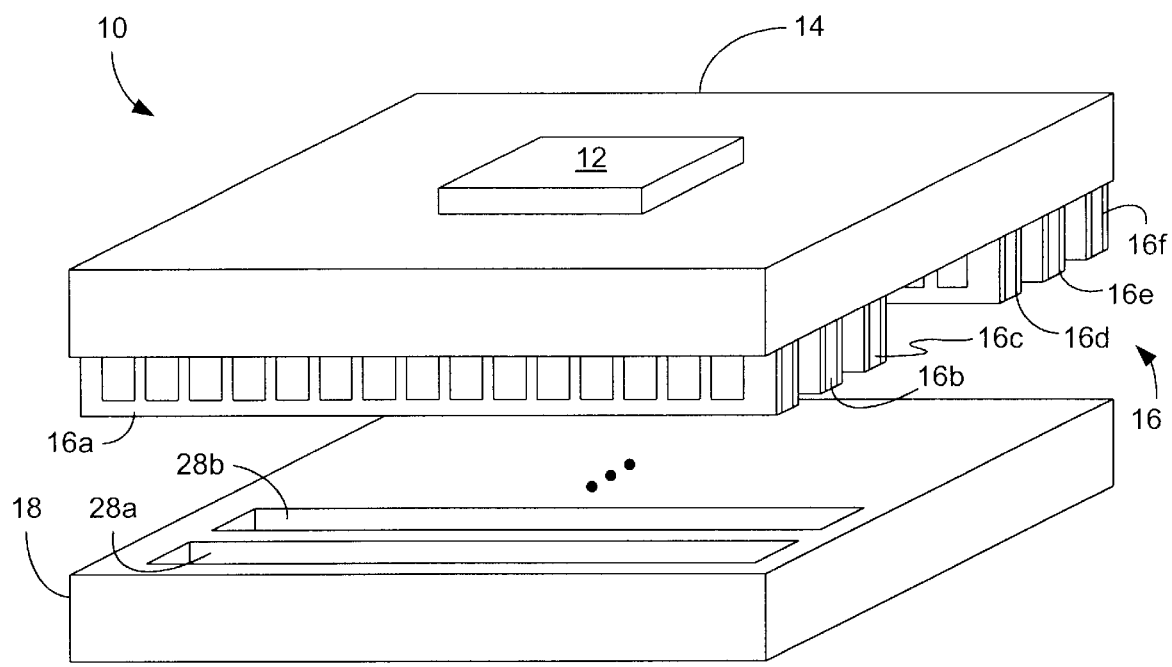
FIG. 1 is a perspective view of an example of a semiconductor package in accordance with one embodiment of the present invention.

FIG. 1. Shows a semiconductor package 10 having a unique socket interface that provides significant advantages over conventional packages. Generally, the package 10 has a semiconductor die 12, a substrate 14 and a plurality of multi-signal bus bars 16. The die 12 has an integrated circuit (IC) such as a computer processor, and the substrate 14 has a die side coupled to the IC. While the illustrated embodiment utilizes controlled collapse chip connection (C4) bonding technology to couple the die 12 to the substrate 14, other approaches such as ball grid array (BGA) or wire bonding may be used. The bus bars 16 are coupled to a socket side of the substrate 14 such that the bus bars 16 enable input/output (I/O) signals to be transported between the substrate 14 and a socket 18. It should be noted that the socket 18 may be hardwired to an adjacent printed wiring board (PWB, not shown) using any acceptable technique such as surface mount technology (SMT) or traditional through-hole technology.

It will be appreciated that by using a uniform bus bar architecture, the above-described manufacturing alignment difficulties associated with hybrid architectures can be obviated. It should also be noted that the number of multi-signal bus bars 16 can vary depending upon the application. For example, the semiconductor package 10 can provide the equivalent of a conventional uniform pin architecture of 800 or more pins.

Figure 2:
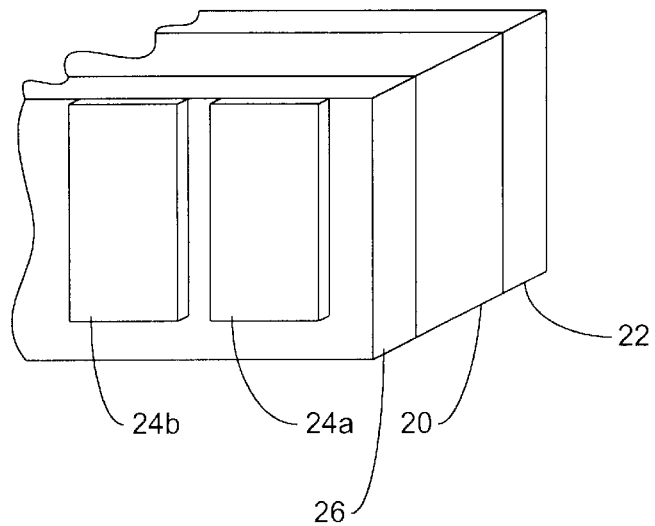
FIG. 2 is an enlarged view of an example of a multi-signal bus bar in accordance with one embodiment of the present invention.

Turning now to FIG. 2, a more detailed view is shown of one of the multi-signal bus bars 16. Specifically, it can be seen that bus bar 16a has a first dielectric member 20, and an electrically conductive reference member 22 coupled to a first surface of the first dielectric member 20. The reference member 22 defines a current path for a referenced signal such as $V_{cc}$ or $V_{ss}$, which are widely used in the computer industry. A first plurality of electrically conductive I/O members 24 are coupled to a second surface of the first dielectric member 20 such that the first I/O members 24 define current paths for a corresponding first plurality of I/O signals. It is preferred that the first I/O members 24 have a predetermined spacing such that the first I/O members 24 are electrically isolated from one another. It should be noted that the spacing can be filled with any medium that does not readily conduct electricity. Thus, while the illustrated embodiment uses air to vertically isolate the first I/O members 24, materials such as ceramic, plastics, etc. may be used without parting from the nature and scope of the invention. It can further be seen that in the illustrated embodiment, a dielectric layer 26 is disposed between the first dielectric member 20 and the first I/O members 24. This approach enables various etching techniques to be used in order to expose and isolate the first I/O members 24. It will be further appreciated that the members 24, 22 can be bonded to the dielectric with any acceptable adhesive material in accordance with well documented bonding techniques. Furthermore, the first I/O members 24 can be designed to have a current carrying capability that is above a predetermined current threshold, and the inductance of the bus bar can be controlled to a predetermined inductance threshold for an operating frequency of the I/C. The result is a significantly enhanced design flexibility.

Figure 4:
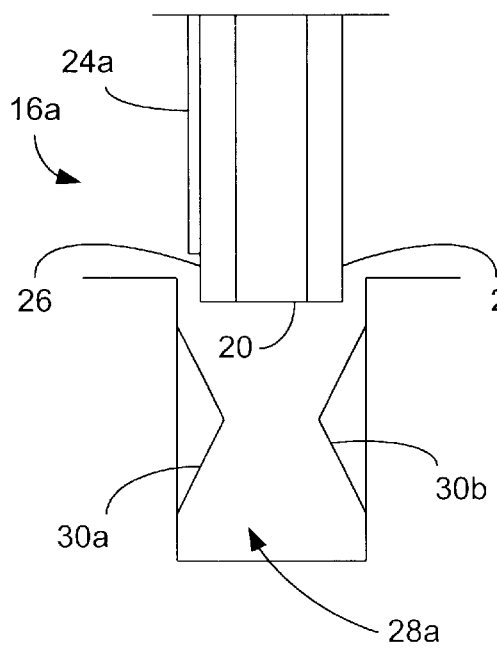
FIG. 4 is a end view of an example of a multi-signal bus bar and a socket in accordance with one embodiment of the present invention.

Turning now to FIGS. 1, 2 and 4, it will be appreciated that the socket 18 has surfaces defining a plurality of bus bar apertures 28 to receive the multi-signal bus bars 16. It can be seen that one approach is to use spring contacts 30 to provide electrical contact between the members 24, 22 and the underlying PWB (not shown). It should be noted that spring contact 30a may differ slightly from spring contact 30b in that spring contact 30a is typically much smaller. This difference is due to the fact that the reference member 22 functions as a power bar and is designed to carry significantly more current than is needed to transport I/O signals. Thus, the reference member 22 (and spring contact 30b) extend the full length of the bus bar 16a, whereas I/O member 24a (and spring contact 30a) extend a much shorter distance. Nevertheless, the spring contacts 30 are resilient, and reconfigure themselves to contact the members 24, 22 when the bus bar 16 is mated with the socket 18. It will be appreciated that other approaches to the socket 18 such as the zero insertion force (ZIF) socket disclosed in U.S. Pat. No. 6,164,999 to McCutchan, et al.

Figure 3:
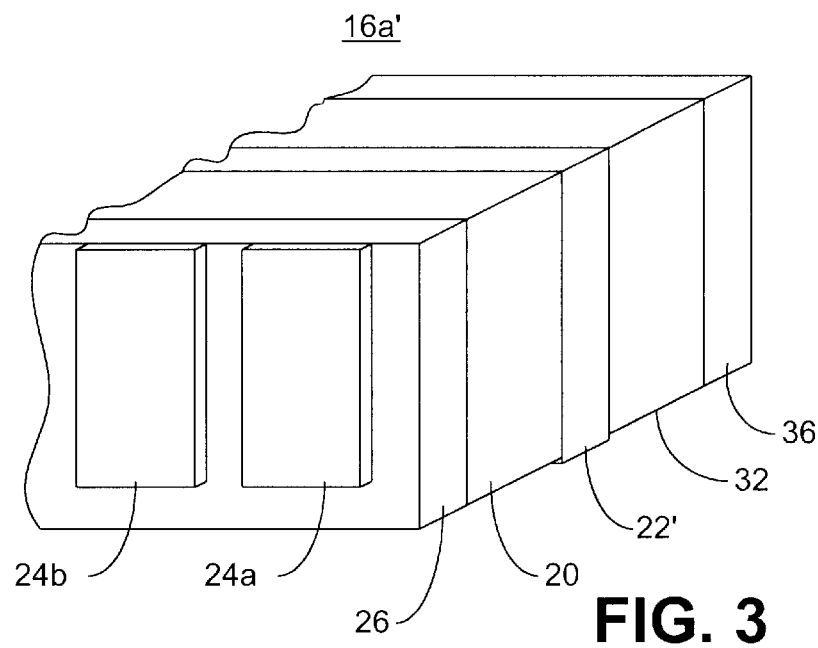
FIG. 3 is a perspective view of an example of a multi-signal bus bar in accordance with an alternative embodiment of the present invention.
Figure 5:
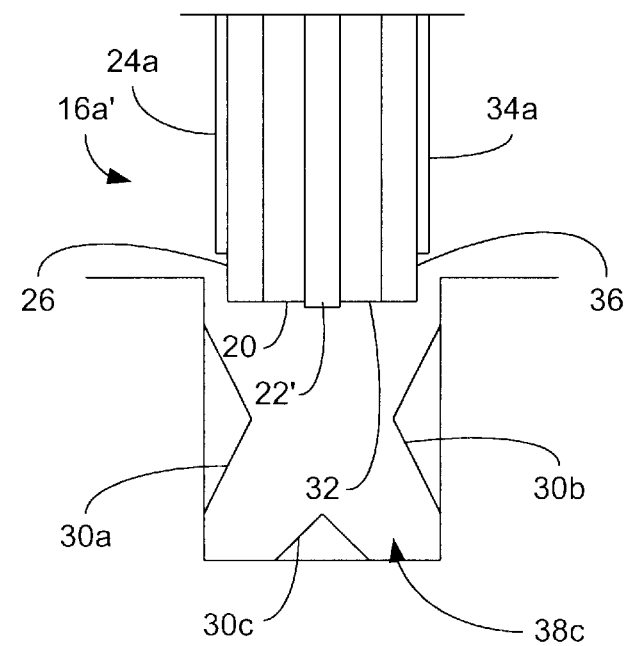
FIG. 5 is an end view of an example of a multi-signal bus bar and a socket in accordance with an alternative embodiment of the present invention.

Turning now to FIGS. 3 and 5, it will be appreciated that the above-described multi-signal bus bar can be expanded to provide several layers of multi-signal interconnection. In this regard, it can seen that the multi-signal bus bar 16a', can further include a second dielectric member 32 and a second plurality of electrically conductive I/O members 34. The second dielectric member 32 has a first surface coupled to the reference member 22' such that the dielectric members 20, 32 are positioned on opposite sides of the reference member 22'. Such an approach is desirable in order to reduce the effects of signal crosstalk and other electromagnetic interference (EMI) issues. The second plurality of electrically conductive I/O members 34 are coupled to a second surface of the second dielectric member 32 such that the second I/O members 34 define current paths for a corresponding plurality of I/O signals. Similarly to the structure discussed above, a second dielectric layer 36 can be exposed between the second I/O members 34 and the second dielectric member 32, if desired. Furthermore, a third spring contact 30c can provide electric interconnection from a bottom surface of the bus bar aperture 38a. It should be noted that although the reference member 22' is shown as having a slightly larger vertical dimension in order to facilitate contact with spring contact 30c, such an approach is not required.

Figure 6:
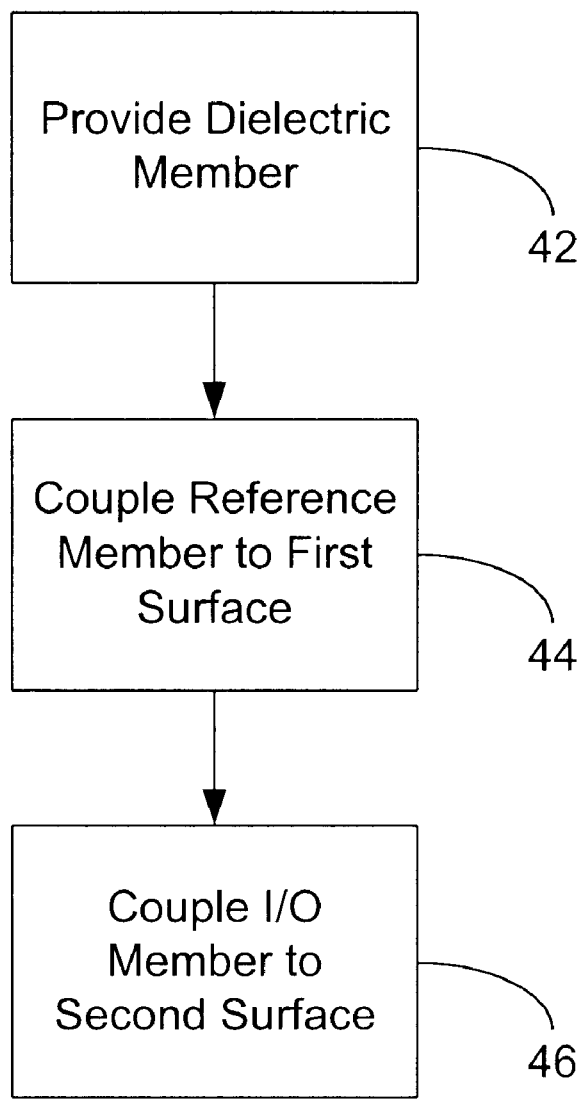
FIG. 6 is a flowchart showing an example of a method of fabricating a multi-signal bus bar in accordance with one embodiment of the present invention.

Turning now to FIG. 6, a method 40 of fabricating a multi-signal bus bar is shown. Generally, a dielectric member is provided at processing block 42. The dielectric member may be constructed of any number of commercial available materials such as ceramic or plastic. An electrically conductive reference member is coupled to a first surface of the dielectric member at block 44, where the reference member defines a current path for a reference voltage signal. Processing block 46 provides for coupling a plurality of electrically conductive I/O members to a second surface of the dielectric members such that the I/O members define current paths for a corresponding plurality of I/O signals. As already discussed, the I/O and reference members may be bonded to the dielectric member with an adhesive material or epoxy. Furthermore, the I/O members are coupled to the second surface at a predetermined spacing such that the I/O members are electrically isolated from one another. The spacing may be achieved by etching away portions of an additional dielectric layer in accordance with established semiconductor fabrication techniques.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. A semiconductor package comprising:

a semiconductor die having a computer processor;

a plurality of die-side contact pads;

a plurality of board-side contact pads;

a substrate base having a plurality of traces and vias interconnecting the die-side contact pads and the board-side contact pads;

a first dielectric member;

an electrically conductive reference member coupled to a first surface of the first dielectric member, the reference member defining a current path for a reference signal;

a first plurality of electrically conductive I/O members coupled to a second surface of the first dielectric member through a first dielectric layer, the first I/O members defining current paths for a corresponding first plurality of I/O signals;

a second dielectric member having a first surface coupled to the reference member, the dielectric members being positioned on opposite sides of the reference member; and a second plurality of electrically conductive I/O members coupled to a second surface of the second dielectric member, the second I/O members defining current paths for a corresponding second plurality of I/O signals, the dielectric members and the I/O members defining a multi-signal bus bar extending from a board side of the semiconductor package, wherein the I/O members have a predetermined spacing, the I/O members being electrically isolated from one another; and a second dielectric layer disposed between the second dielectric member and the second I/O members.

2. The package of claim 1, wherein the I/O members have a current carrying capability that is above a predetermined current threshold.

3. The package of claim 1, wherein the bus bar has an inductance that is controlled to a predetermined inductance threshold for an operating frequency of the computer processor.

* * * * *